(12) United States Patent
Egashira et al.

(10) Patent No.: US 7,347,214 B2
(45) Date of Patent: Mar. 25, 2008

(54) ROTARY SHAFT SEALING MECHANISM AND LIQUID PROCESSING APPARATUS

(75) Inventors: Koji Egashira, Tosu (JP); Yuji Kamikawa, Tosu (JP); Masaki Taira, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 580 days.

(21) Appl. No.: 10/393,882

(22) Filed: Mar. 21, 2003

(65) Prior Publication Data

US 2003/0178785 A1    Sep. 25, 2003

(30) Foreign Application Priority Data

Mar. 22, 2002 (JP) ............................. 2002-080630
Jan. 30, 2003 (JP) ............................. 2003-022590

(51) Int. Cl.
*B08B 9/02* (2006.01)

(52) U.S. Cl. ..................... 134/148; 134/153; 134/902; 277/917

(58) Field of Classification Search ................ 134/902, 134/148, 153; 277/917, 415
See application file for complete search history.

(56) References Cited

U.S. PATENT DOCUMENTS 2,907,595 A * 10/1959 Benson et al. .............. 277/303
3,093,282 A * 6/1963 Hezzlewood .................. 226/7
3,531,131 A * 9/1970 Hummer ....................... 277/397
3,823,950 A * 7/1974 Pederson ...................... 277/415
4,060,250 A * 11/1977 Davis et al. ................. 277/415
4,098,515 A * 7/1978 Sakata ......................... 277/406
4,337,951 A * 7/1982 Perego ......................... 277/415
4,815,747 A * 3/1989 Wolford ....................... 277/306
5,435,075 A 7/1995 Shiraishi et al.

FOREIGN PATENT DOCUMENTS

JP    11-111511    * 4/1999

* cited by examiner

*Primary Examiner*—Frankie L. Stinson
(74) *Attorney, Agent, or Firm*—Morrison & Foerster LLP

(57) ABSTRACT

The present invention provides a rotary shaft sealing mechanism having the seal between the rotary shaft and the seal ring improved, and a liquid processing apparatus including the rotary shaft sealing mechanism.

The cleaning processing apparatus 1 comprises a rotor 34 for holding wafers W, an outer chamber 71a and an inner chamber 71b which can house the rotor 34, a spindle 50 for rotating the rotor 34, and an outer cylindrical member 32 disposed around the spindle 50. A first sealing ring 13, etc. of resins are provided in a ring member 12 constituting the outer cylindrical member 32. A clearance between the spindle 50 and the first sealing ring 13 is adjusted by press inserting the spindle 50 into the first sealing ring 13, etc. and rotating the spindle 50 for a prescribed period of time to abrade the fist sealing ring 13, etc.

18 Claims, 9 Drawing Sheets

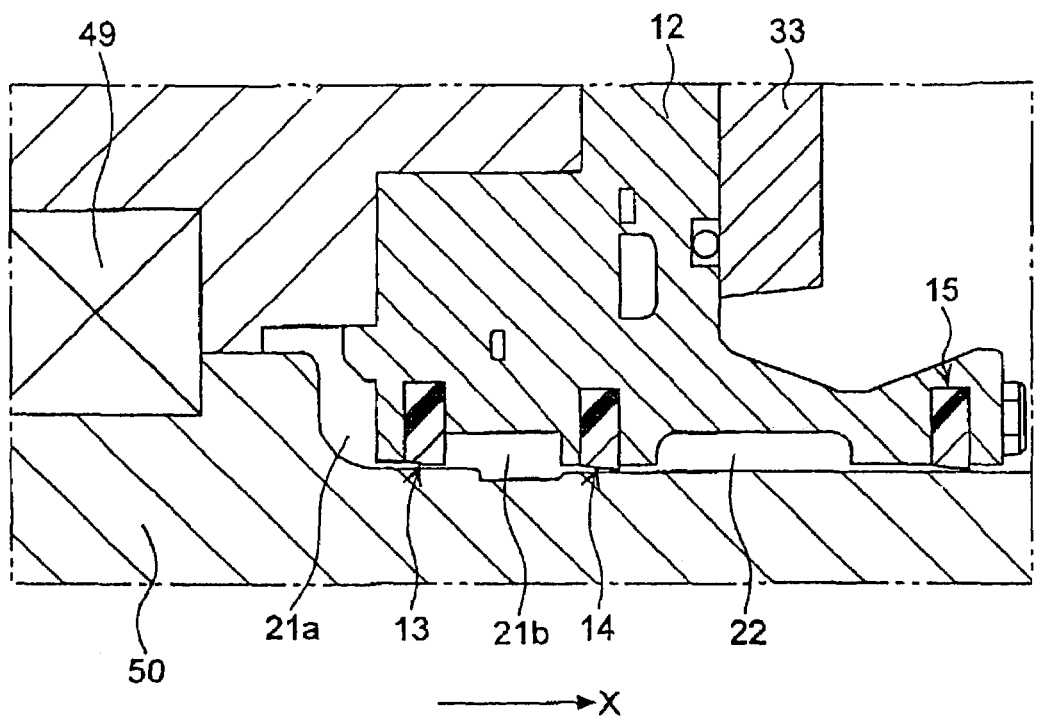
F I G. 7
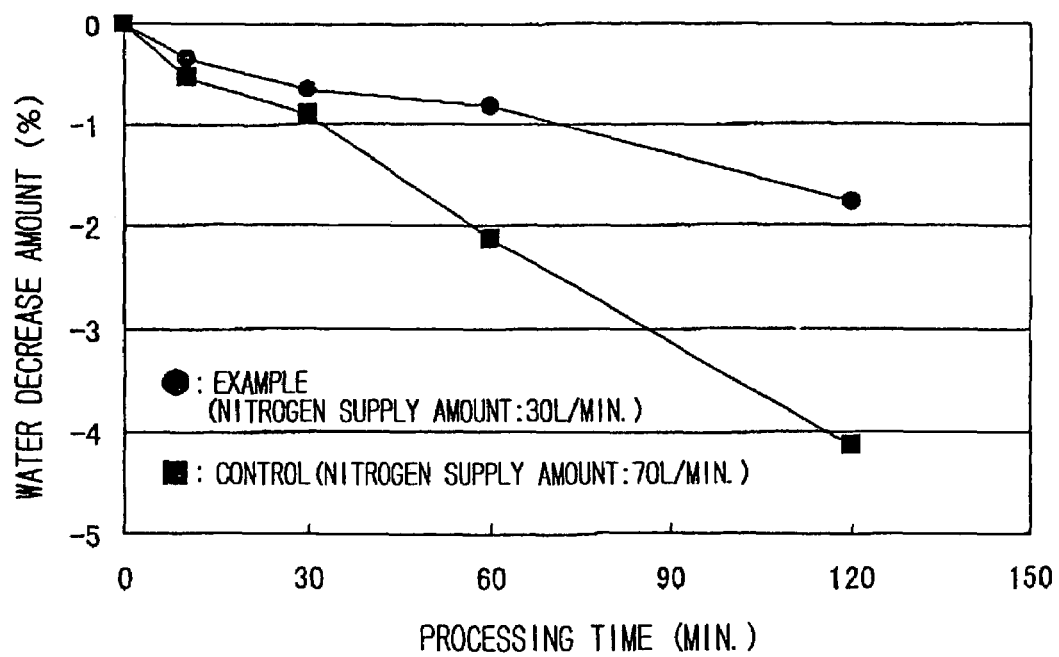
F I G. 8

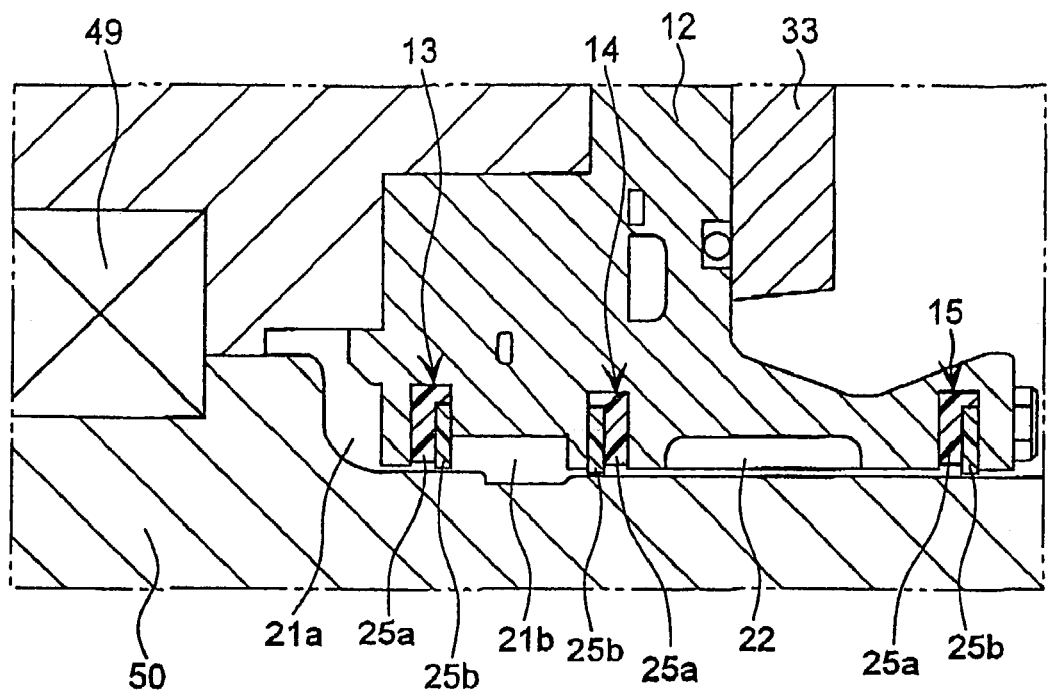
F I G. 9
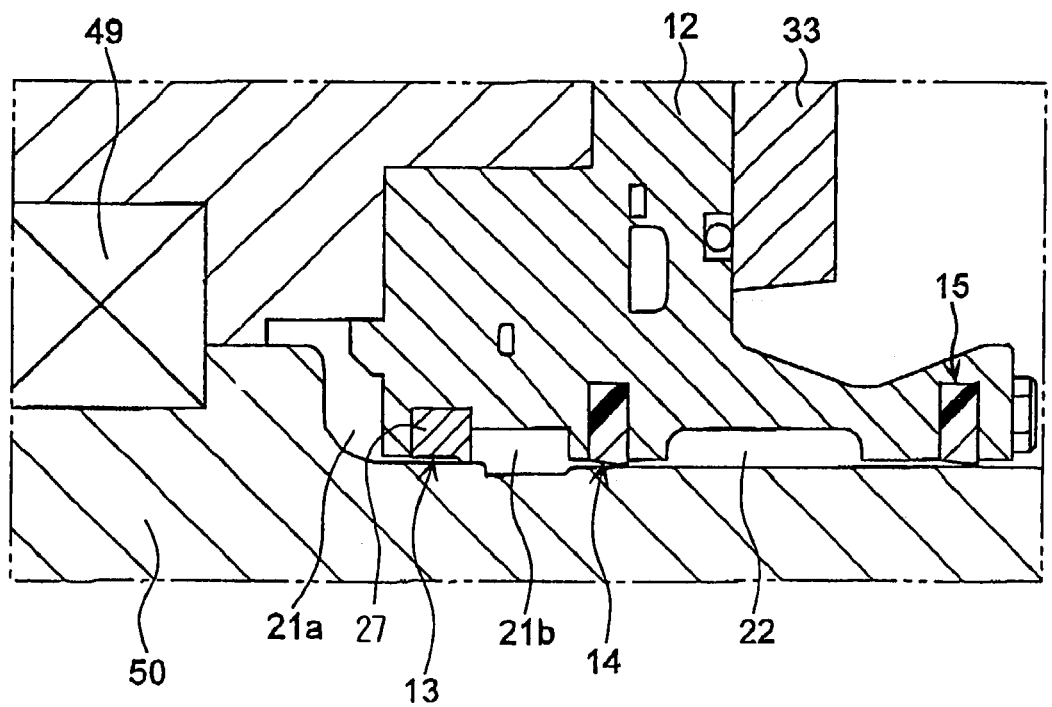
F I G. 10

ROTARY SHAFT SEALING MECHANISM AND LIQUID PROCESSING APPARATUS

CROSS REFERENCE TO RELATED APPLICATIONS

The subject application is related to subject matter disclosed in Japanese Patent Application No. 2002-080630 filed on Mar. 22, 2002 and Japanese Patent Application No.2003-22590 filed on Jan. 30, 2003, to which the subject application claims priority under Paris Convention and which are incorporated herein by reference.

BACKGROUND OF THE INVENTION

1. Field of the Invention

The present invention relates to a sealing mechanism for a rotary shaft for rotating a body-to-be-rotated arranged in a chamber, and a liquid processing apparatus using the rotary shaft sealing mechanism.

2. Related Background Art

In processes for fabricating semiconductor devices, for example, cleaning processing apparatuses are used, which process semiconductor wafers (hereinafter called "wafers") with processing liquids, such as prescribed chemical liquids, pure water, etc. to thereby remove from the wafers particles, contaminants such as organic contaminants, metal contaminants, etc., organic matters and oxide films.

As one of such cleaning processing apparatuses, the specification of Japanese Patent Application Unexamined Publication No. 42919/1986 (Patent Reference 1), for example, discloses a processing spray which comprises a drive shaft (rotary shaft) rotatably put through the bottom surface of a housing, a turn table mounted on the drive shaft in the housing with a turn table mounting ring, a carrier supported by the turn table, which supports a plurality of wafers substantially in parallel with each other, and a spray post for spraying a processing liquid to the wafers. In this processing spray, in order to prohibit a processing liquid from intruding into the rotary shaft, a labyrinth sealing structure constituted with conical ribs and conical grooves is formed between the underside of the turn table mounting ring and the upper side of the bottom surface of the housing opposed to each other.

[Patent Reference 1]

Specification of Japanese Patent Application Unexamined Publication No. 42919/1986 (Ps. 3-5, FIGS. 1 and 3)

In the labyrinth seal structure, the direction of a processing liquid is changed when the processing liquid intrudes into the rotary shaft, which hinders the processing liquid from intruding into the rotary shaft. However, a large gap is required over the part for the ribs and the grooves engaged with each other so that the turn table mounting ring and the bottom surface of the housing are not in contact with each other, which makes it difficult to perfectly prevent a processing liquid from intruding into the rotary shaft.

SUMMERY OF THE INVENTION

In view of the above-described fact, the present invention has been made, and an object of the present invention is to provide a rotary shaft sealing mechanism having high sealing achievement, and a liquid processing apparatus having such rotary shaft sealing mechanism.

The present invention provides a rotary shaft sealing mechanism comprising:

a rotary shaft for rotating a body-to-be-rotated;

an outer cylindrical member disposed around the rotary shaft in an arrangement which does not hinder the rotation of the rotary shaft; and a sealing ring of a resin held by the outer cylindrical member in an arrangement which permits the rotary shaft to be passed through the sealing ring, a clearance between the rotary shaft and the sealing ring being adjusted by press inserting the rotary shaft into the sealing ring and rotating the rotary shaft for a prescribed period of time to abrade the sealing ring.

Furthermore, the present invention provides a cleaning processing apparatus having such rotary shaft sealing mechanism.

That is, the present invention provides a cleaning processing apparatus for liquid processing an object-to-be-processed held by a body-to-be-rotated with a prescribed processing liquid, comprising:

a chamber for housing the body-to-be-rotated;

at least one processing liquid supply nozzle for supplying the prescribed processing liquid to the object-to-be-processed held by the body-to-be-rotated;

a rotary mechanism including a rotary motor, a rotary shaft interconnecting the rotary motor and the body-to-be-rotated, an outer cylindrical member disposed around the rotary shaft in an arrangement which does not hinder the rotation of the rotary shaft, and a sealing ring of a resin held by the outer cylindrical member in an arrangement which permits the rotary shaft to be passed through the sealing ring, a clearance between the rotary shaft and the sealing ring being adjusted by press inserting the rotary shaft into the sealing ring and rotating the rotary shaft for a prescribed period of time to abrade the sealing ring.

According to the rotary shaft sealing mechanism, a clearance between the rotary shaft and the sealing ring which are not in contact with each other can be made very small, whereby a fluid cannot easily pass through the gap between the sealing ring and the rotary shaft, and high sealing can be provided. The liquid processing apparatus having the rotary shaft sealing mechanism can have improved seal between the gap defined between the rotary shaft and the outer cylindrical member, and the processing chamber in which the body-to-be-rotated to be housed, whereby a processing liquid cannot easily intrude into the gap between the rotary shaft and the outer cylindrical member.

Furthermore, the present invention provides a liquid processing apparatus for liquid processing an object-to-be-processed held by a body-to-be-rotated with a prescribed processing liquid, comprising:

a chamber for housing the body-to-be-rotated;

at least one processing liquid supply nozzle for supplying the prescribed processing liquid to the object-to-be-processed held by the body-to-be-rotated;

a rotary motor;

a rotary shaft interconnecting the rotary motor and the body-to-be-rotated;

an outer cylindrical member disposed around the rotary shaft in an arrangement which does not hinder the rotation of the rotary shaft;

a first sealing ring of a resin held by the outer cylindrical member at a position nearer to the body-to-be-rotated, and a second sealing ring of a resin held by the outer cylindrical member at a position nearer to the rotary motor, which are spaced from each other by a prescribed distance longitudinally of the outer cylindrical member in an arrangement which permits the rotary shaft to be passed through the first sealing ring and the second sealing ring;

a gas supply port formed in the outer cylindrical member substantially diametrically thereof between the position where the first sealing ring is disposed and the position where the second sealing ring is disposed, for supplying a prescribed gas into a gap between the outer cylindrical member and the rotary shaft; and an exhaust port formed in the outer cylindrical member substantially diametrically thereof at a position nearer to the rotary motor than to the position of the second sealing ring, for exhausting the gap between the outer cylindrical member and the rotary shaft, respective clearances between the first and the second sealing rings, and the rotary shaft being adjusted by press inserting the rotary shaft into the first and the second sealing rings and rotating the rotary shaft for a prescribed period of time to abrade the first and the second sealing rings.

In the liquid processing apparatus, the gap between the rotary shaft and the sealing ring can be small, whereby a gas does not easily pass through the gap, and accordingly, a gas amount to be supplied between the rotary shaft and the outer cylindrical member can be small. Thus, the liquid processing apparatus can have low running costs. Because of a small gas amount flowing into the chamber, an amount of particles to be discharged into the chamber can be small, which reduces the contamination of a processing liquid. Furthermore, a gas amount to be discharged from the chamber can be accordingly reduced, whereby the processing liquid is prevented from drying, which can elongate a lifetime of the processing liquid.

BRIEF DESCRIPTION OF THE DRAWINGS

FIG. 7 is a detailed sectional view of the structure of the sealing mechanisms shown in FIGS. 4, 5 and 6.

FIG. 8 is a graph of relationships between water decrease amounts of a chemical liquid and processing periods of time given when different amounts of nitrogen gas are fed into the gas supply chamber having the sealing mechanism.

FIG. 9 is a sectional view of the sealing mechanism according to another embodiment of the present invention.

FIG. 10 is a sectional view of the sealing mechanism according to other embodiment of the present invention.

DESCRIPTION OF THE PREFERRED EMBODIMENTS

Embodiments of the present invention will be detailed below with reference to the drawings attached hereto. Here the present invention is applied to a cleaning processing apparatus for making batch-type cleaning processing on semiconductor wafers (wafers).

Figure 1:
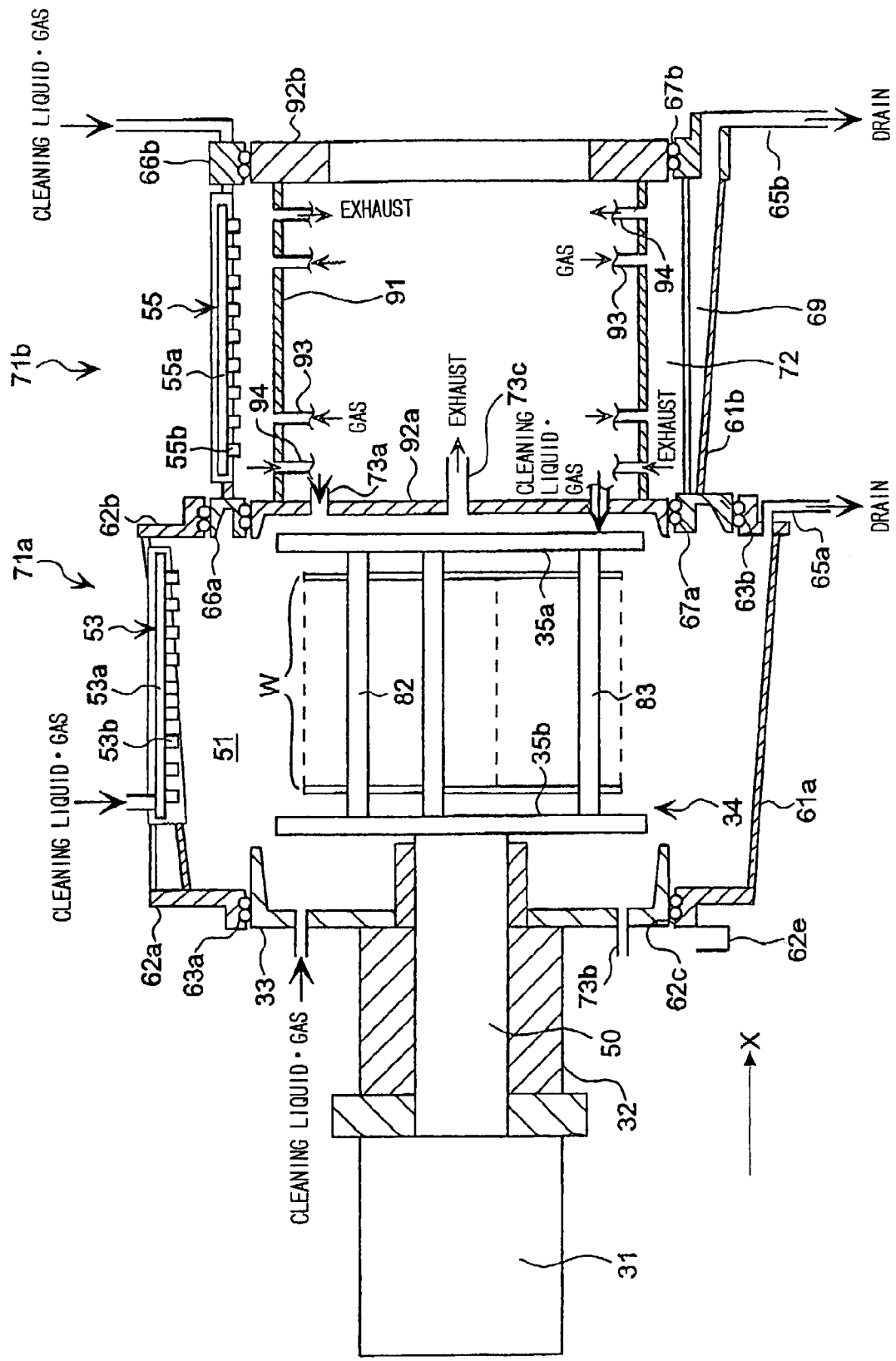
FIG. 1 is a sectional view of the cleaning processing apparatus according to an embodiment of the present invention, with the rotor advanced therein.
Figure 2:
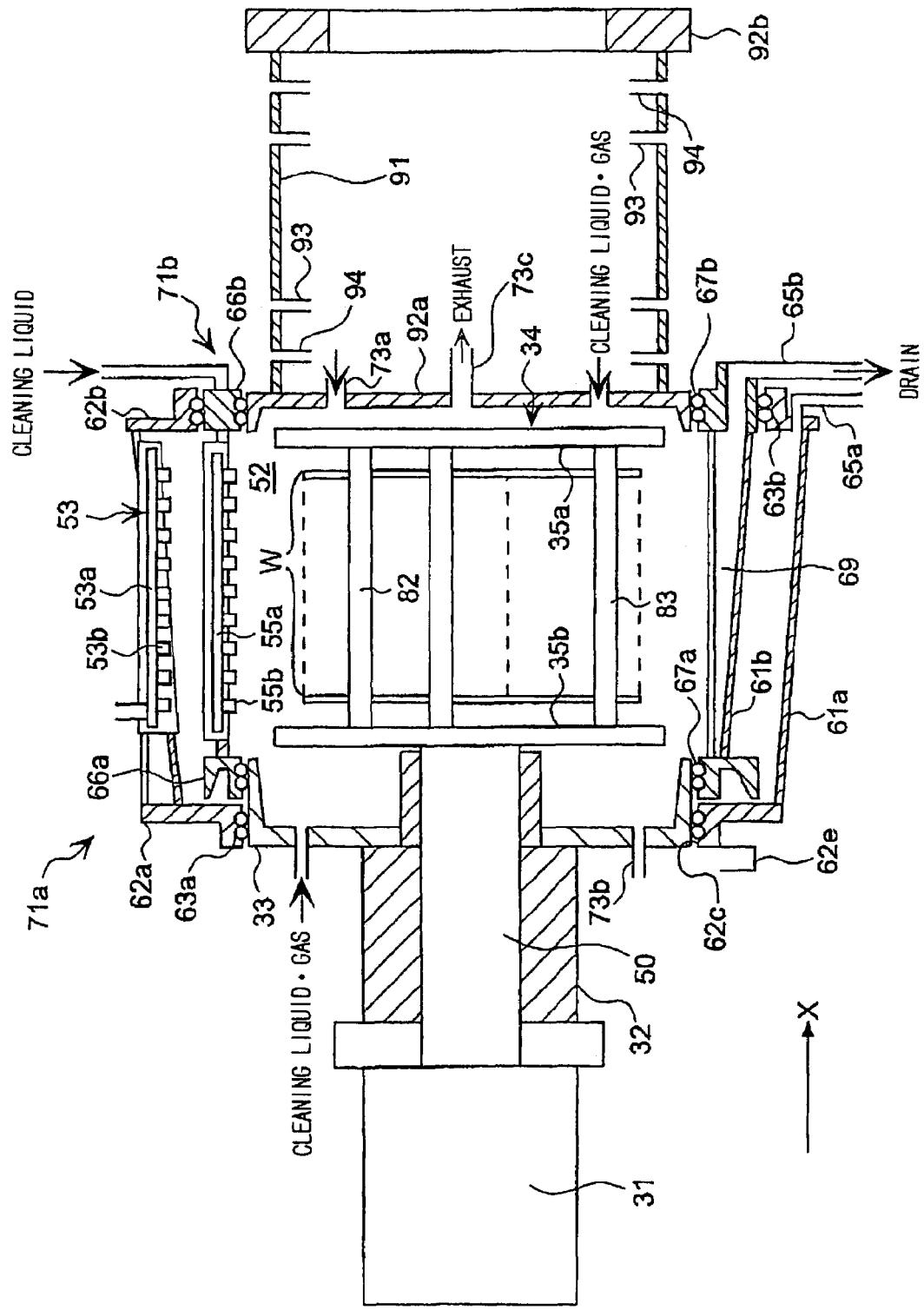
FIG. 2 is another sectional view of the cleaning processing apparatus according to an embodiment of the present invention with the rotor advanced therein.

FIGS. 1 and 2 are sectional views of the cleaning processing apparatus for cleaning processing wafers W. The cleaning processing apparatus 1 comprises a rotor 34 for holding wafers W, an outer chamber 71a for housing the rotor 34, and an inner chamber 71b which can be advanced into and out of the outer chamber 71a and can house the rotor 34 therein, held in the outer chamber 71a.

The outer chamber 71a is secured by a securing member not shown, such as a housing frame or others for, e.g., the cleaning processing apparatus 1. FIG. 1 shows the state of the inner chamber 71b retreated outside the outer chamber 71a (hereinafter the position of the inner chamber 71b shown in FIG. 1 is called "the retreated position"). FIG. 2 shows the state of the inner chamber 71b housed in the outer chamber 71a (hereinafter the position of the inner chamber shown in FIG. 2 is called "the processing position"). At the retreated position of the inner chamber 71b, a disc 92a, a ring member 92b and a cylindrical body 91 are disposed. A pure water injection nozzle 83a and an exhaust pipe 73c are provided in the disc 92a, and a gas feed nozzle 93 and an exhaust pipe 94 are provided in the cylindrical body 91.

The rotor 34 has the structure that a locking member 82 and a holder 83 are disposed between discs 35a, 35b. Grooves not shown for holding wafers W are formed at a certain pitch in the locking member 82 and the holder 83. The rotor 34 can hold, e.g., 25 wafers which are held substantially vertically and arranged in one row horizontally (in the X direction).

A spindle (rotary shaft) 50 is connected to the rotor 34, and a rotary motor 31 is mounted on the other end of the spindle 50. An outer cylindrical member 32, and a cap 33 which closes the end surface of the outer chamber 71a are disposed around the spindle 50. The rotor 34, the spindle 50, rotary motor 31, the outer cylindrical member 32 and the cap 33 are capable of being slid in one-piece in the X direction by a slide mechanism (not shown). The slide mechanism is operated to advance and retreat the rotor 34 into and out of the outer chamber 71a. In FIGS. 1 and 2, the structures of the outer cylindrical member 32, the cap 33 and the spindle 50 are simplified. The structure around the spindle 50 will be detailed later.

The outer chamber 71a includes a cylindrical body 61a, ring members 62a, 62b disposed on the end surfaces of the cylindrical body 61a, a sealing mechanism 63a disposed on the inner circumferential surface of the ring member 62a, a sealing mechanism 63b disposed on the inner circumferential surface of the ring member 62b, and a cleaning liquid injecting nozzle 53 for feeding pure water, etc. to the wafers W held by the rotor 34. A cleaning liquid injecting nozzle 53 is mounted on the cylindrical body 61a. An exhaust/drain pipe 65a for discharging the cleaning liquid and the gas in the outer chamber 71a is disposed at a lower part of the outer chamber 71a.

The inner chamber 71b includes a cylindrical body 61b, ring members 66a, 66b disposed on the end surfaces of the cylindrical body 61b, a sealing mechanism 67a and 67b disposed on the inner circumferential surface of the ring member 66a and 66b respectively, and a cleaning liquid injecting nozzle 55 for feeding chemicals, etc. to the wafers W held by the rotor 34. The cleaning liquid injecting nozzle 55 is disposed in the cylindrical body 61b, and an exhaust/drain pipe 65b for discharging the cleaning liquid and the gas in the inner chamber 71b.

The rotor 34 is advanced/retreated through the bore 62c of the ring member 62a. With the rotor 34 advanced in the outer chamber 71a, the bore 62c is closed by the cap 33, and the gap between the outer circumferential surface of the cap 33 and the bore 62c is sealed by the sealing mechanism 63a. A liquid receiver 62e is disposed at a lower part of the ring member 62a so that when the rotor 34 is retreated out of the outer chamber 71a, the pure water, etc. staying on the cap 33, the sealing mechanism 63a, etc. do not drop onto floors (not shown).

In the sate shown in FIG. 1, in which the inner chamber 71b is in the retreated position, the ring member 66a and the ring member 62b are sealed with respect to each other by the sealing mechanism 63b, and the sealing mechanism 67a seals the space between the ring member 66a and the disc 92a. The bore 62c, through which the rotor 34 is advanced/retreated, is closed by the cap 33 and the sealing mechanism 63a. Thus, with the inner chamber 71b in the retreated position, a processing chamber 51 is defined.

The cylindrical body 61a is tapered so that an outer diameter of the ring member 62b is larger than that of the ring member 62a to position the lower end of the ring member 62b lower than the lower end of the ring member 62a. In the thus arranged processing chamber 51, pure water, etc. injected from the cleaning liquid injecting nozzle 53 to the wafers W flows by themselves along the bottom surface of the cylindrical body 61a from the side of the ring member 62a to the side of the ring member 62b to be discharged outside through the exhaust/drain pipe 65a.

In the state shown in FIG. 2, in which the inner chamber 71b is in the processing position, the inner circumferential surface of the ring member 66a is sealed with respect to the cap 33 by the sealing mechanism 67a, and the ring member 66b is sealed with respect to the ring member 62b by the sealing mechanism 63b. Furthermore, the ring member 66b is sealed with respect to the disc 92a by the sealing mechanism 67b. The processing chamber 52 is thus defined when the inner chamber 71b is in the processing position.

The cylindrical body 61b forming the inner chamber 71b is formed in a cylinder. In order to facilitate draining the cleaning liquid outside, a grooved portion 69 having a prescribed gradient is formed, bulged from the cylindrical body 61b. For example, in the state that the processing chamber 52 is defined by the inner chamber 71b, chemical liquid, etc. injected from the cleaning liquid injection nozzle 55 to the wafers W flows through the grooved portion 69 to be discharged outside through the exhaust/drain pipe 65b.

Pure water and IPA, and drying gas, such as nitrogen ($N_2$), etc. are fed to the cleaning liquid injection nozzle 53, and the pure water, etc. are injected to the wafers W held by the rotor 34. Similarly, chemical liquids, and cleaning liquids, such as pure water, IPA, etc., are fed to the cleaning liquid injection nozzle 55, and the chemical liquids, etc can be injected to the wafers W held by the rotor 34. In FIGS. 1 and 2, only one cleaning liquid injection nozzle 53 and only one cleaning liquid injection nozzle 55 are shown, but the cleaning liquid injection nozzles 53, 55 may be provided respectively in plural numbers. The cleaning liquid injection nozzles 53, 55 are not disposed essentially exactly above the cylindrical bodies 61a, 61b.

From a pure water injection nozzle 73a disposed in the disc 92a, pure water and drying gas for cleaning and drying the disc 35a forming the rotor 34 can be injected. A pure water injection nozzle 73b is disposed in the cap 33 so that the disc 35b can be cleaned and dried. In order to establish a prescribed gas atmosphere in the processing chambers 51, 52, oxygen ($O_2$) gas, carbon dioxide ($CO_2$) gas, etc., for example, can be injected from the pure water injection nozzle 73a. An exhaust pipe 73c disposed in the disc 92a exhausts the processing chambers 51, 52.

In the state that the inner chamber 71b is in the retreated position, the ring member 66a is sealed with respect to the disc 92a by the sealing mechanism 67a, and the ring member 66b is sealed with respect to the ring member 92b by the sealing mechanism 67b, whereby an annular space 72 is defined between the outer circumference of the cylindrical body 91 and the inner circumference of the cylindrical body 61b. Pure water is injected from the cleaning liquid injection nozzle 55 into the annular space 72 to rinse the inner surface of the cylindrical body 61b, and then a drying gas, such as nitrogen gas or others, is injected from the gas supply nozzle 93 and the cleaning liquid injection nozzle 55. Thus, the inner circumferential surface of the inner chamber 71b can be cleaned. The gas supply nozzle 93 may inject pure water.

Figure 3:
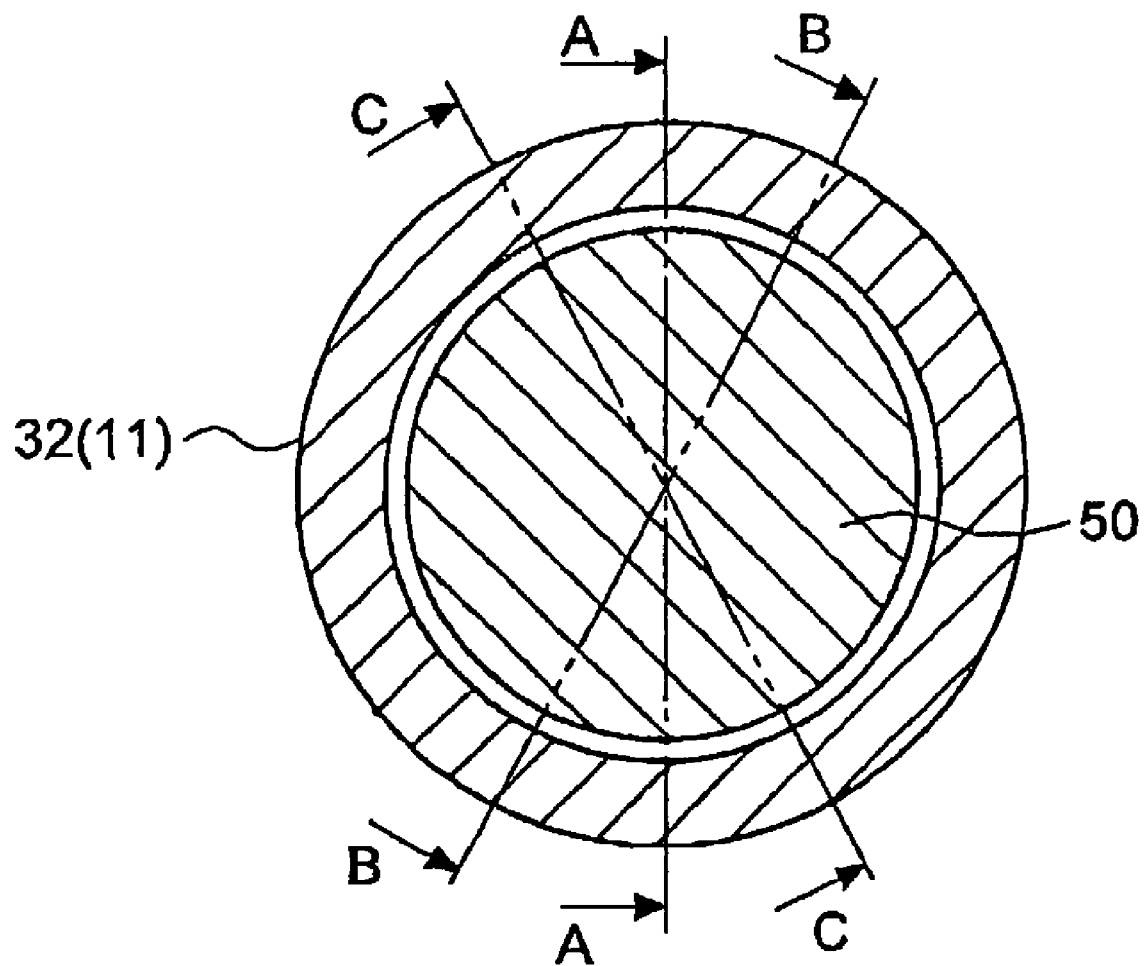
FIG. 3 is a simplified sectional view of the spindle and the outer cylindrical member.
Figure 4:
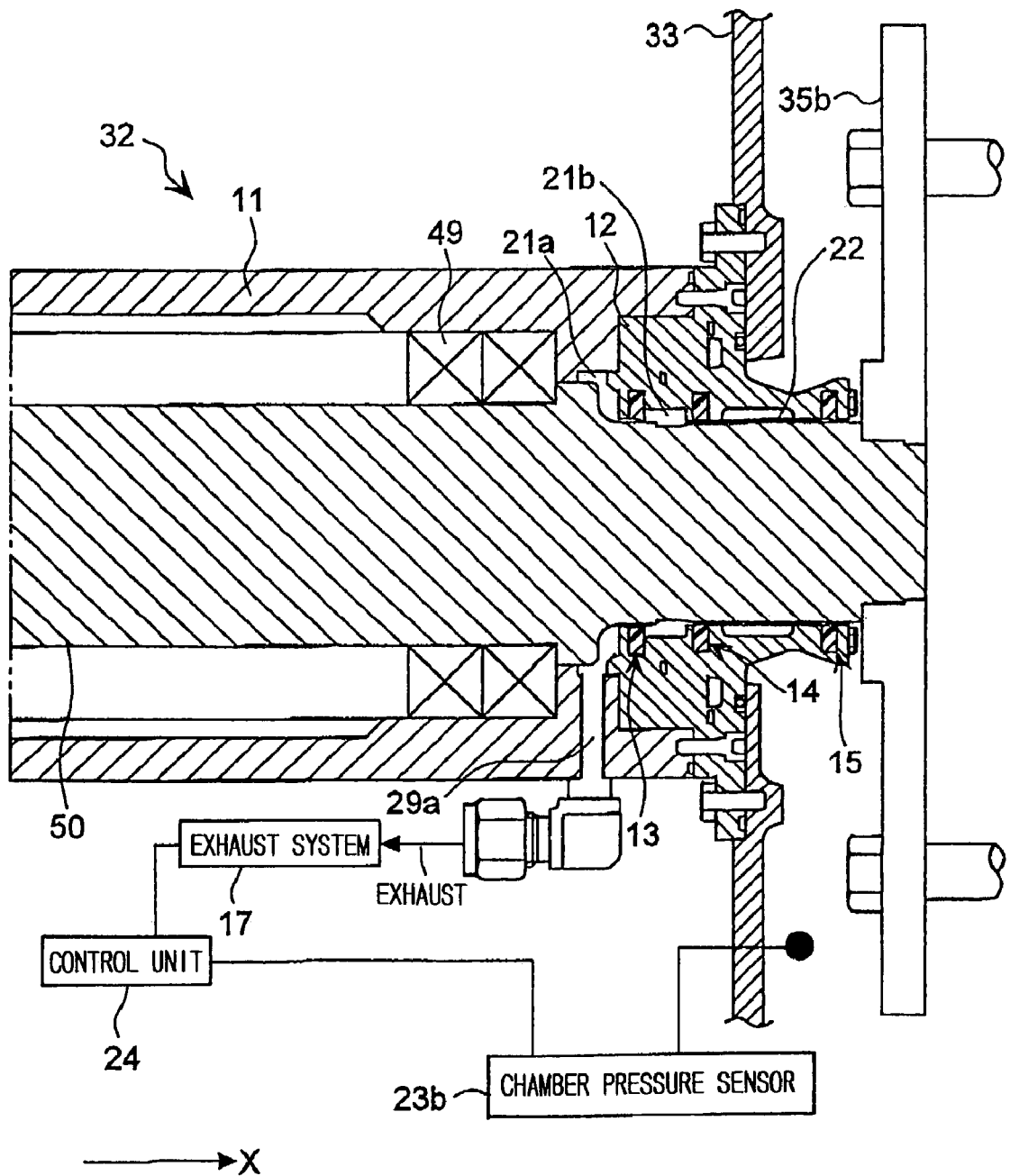
FIG. 4 is the sectional view along the line A-A in FIG. 3.
Figure 5:
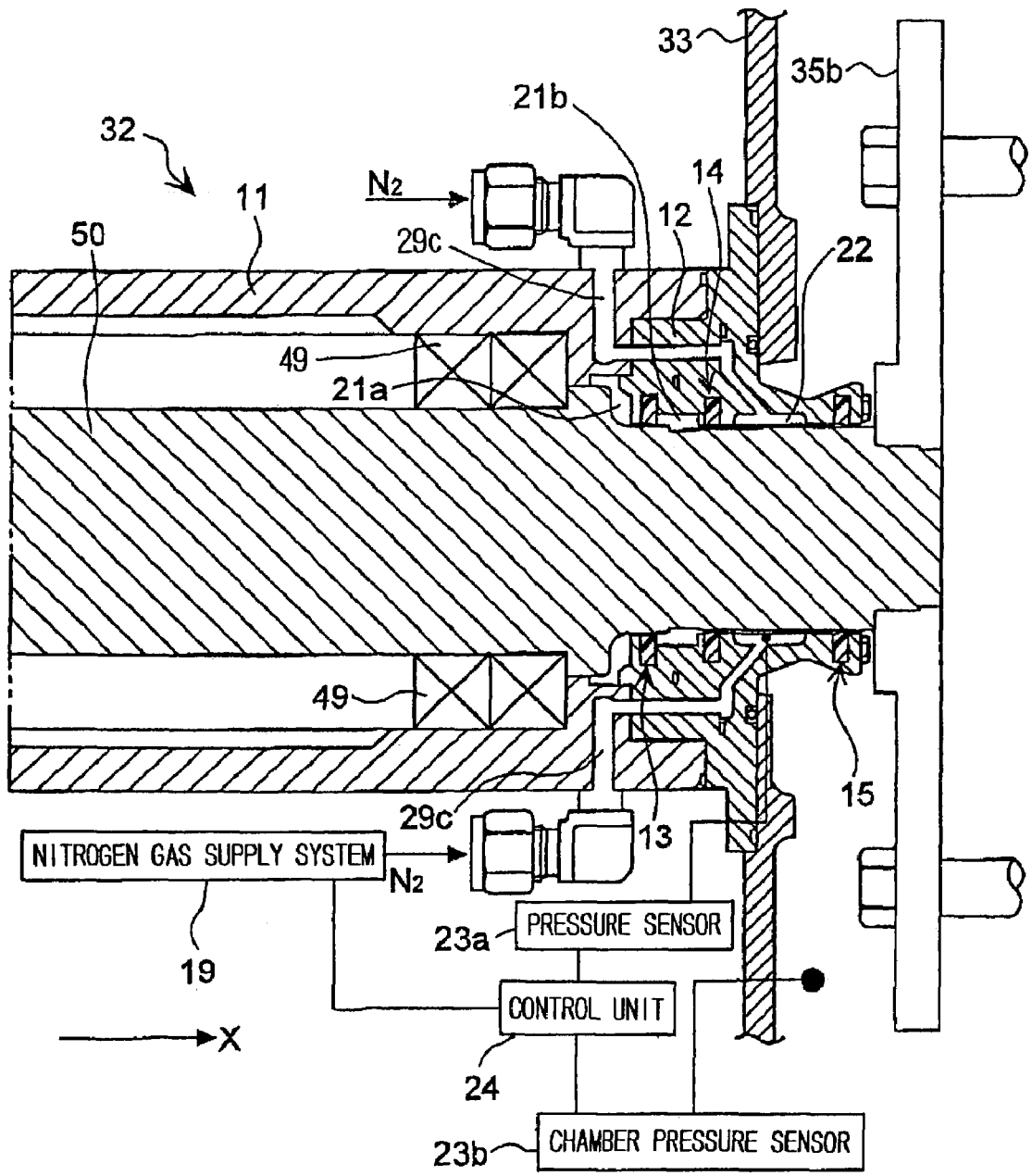
FIG. 5 is the sectional view along the line B-B in FIG. 3.
Figure 6:
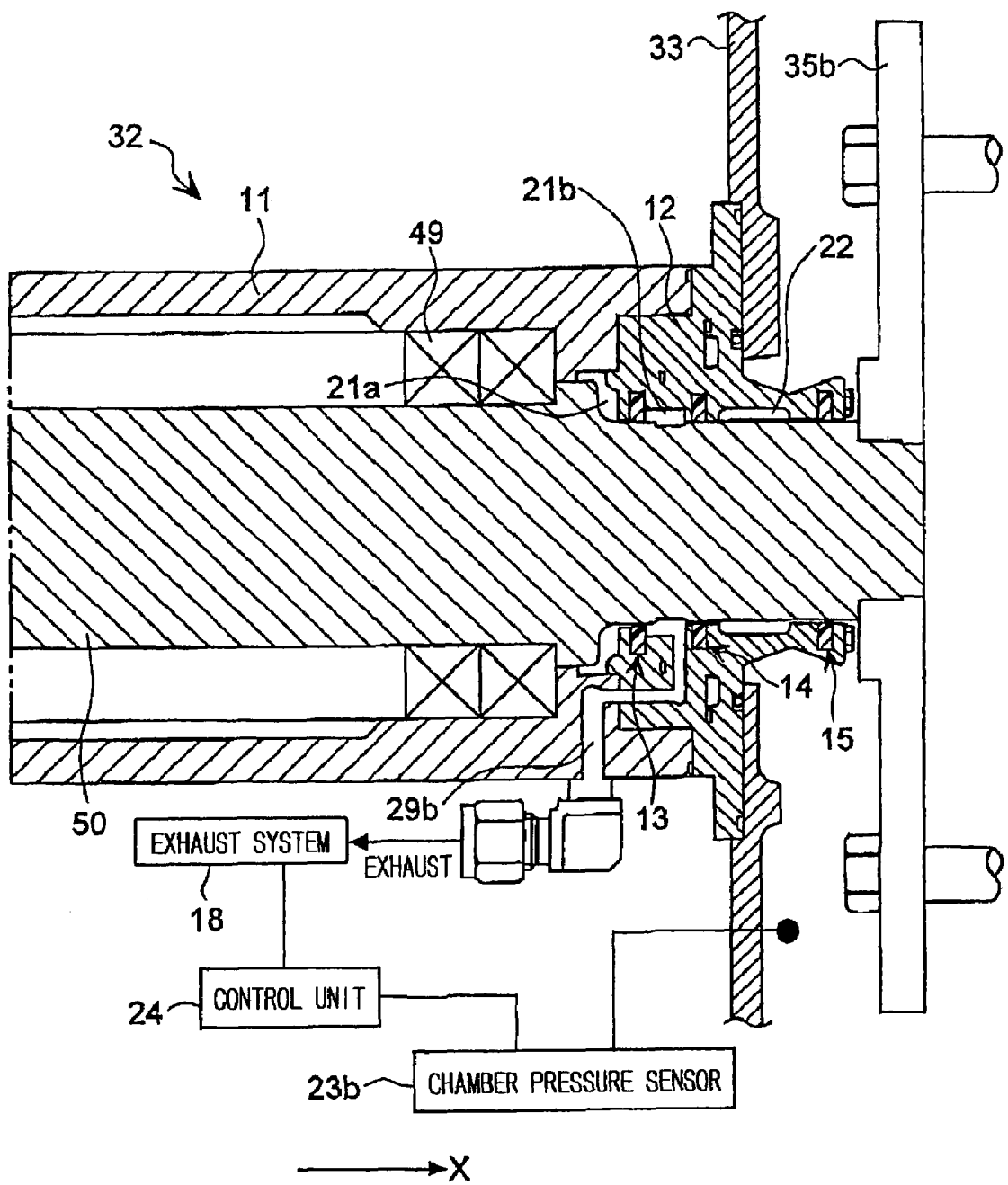
FIG. 6 is the sectional view along the line C-C line in FIG. 3.

Then, the structure around the spindle 50 will be detailed. FIG. 3 is a simplified sectional view of the spindle 50 and the outer cylindrical member 32. FIG. 4 is the sectional view along the line A-A' in FIG. 3. FIG. 5 is the sectional view along the line B-B' in FIG. 3. FIG. 6 is the sectional view along the line C-C' in FIG. 3. FIGS. 4, 5 and 6 show in good details the structure of the outer cylindrical member 32, the cap 33 and the spindle 50. FIG. 7 is a partial enlarged view of the sectional view of FIG. 4.

As shown in FIGS. 4 to 6, the forward end of the rotor 34 is inserted in the disc 35b forming the rotor 34 to secure the disc 35b. The constituent members other than the disc 35b are omitted in FIGS. 4 to 6.

The outer cylindrical member 32 includes a cylindrical member 11 and a ring member 12. A bearing 49 is disposed between the cylindrical member 11 and the spindle 50 in such a manner that the rotation of the spindle is not hindered. The ring member 12 is secured to the cylindrical member 11 by screws. A first sealing ring 13, a second sealing ring 14 and a third sealing ring 15 are held by the ring member 12. The ring member 12 is formed of a plurality of parts, and the first sealing ring 13, the second sealing ring 14 and the third sealing ring 15 are held by the ring member 12, which is assembled, urged in the X direction by a prescribed force.

The cylindrical member 11 and the ring member 12 have complicated configurations, but a clearance (gap width) of, e.g., the part where the cylindrical member 11 and the spindle 50 are most adjacent to each other is about 100 µm. This clearance is the same with the ring member 12. Clearances between the first sealing ring 13, the second sealing ring 14 and the third sealing ring 15, and the spindle 50 is about 10-50 µm. As will be detailed later, the first sealing ring 13 is formed of a resinous material and has a smaller inner diameter than a diameter of the spindle 50. Such first sealing ring 13 is press fit into the spindle 50, and the spindle 50 is turned to abrade the first sealing ring 15 to enlarge the inner diameter. This is the same with the second and the third sealing rings 14, 15.

The configurations of the cylindrical member 11, the spindle 50 and the ring member 12 are designed so that a first exhaust chamber 21a and a second exhaust chamber 21b which are substantially ring-shaped can be formed around the spindle 50. The first exhaust chamber 21a is in communication with a first port 29a formed in the cylindrical member 11 (FIG. 4), and the first port 29a is connected to an exhaust system 17. The second exhaust chamber 21b is in communication with a second port 29b (FIG. 6) formed through the cylindrical member 11 and the ring member 12. A gas supply chamber 22 is in communication with a third port 29c (FIG. 5) formed through the cylindrical member 11 an the ring member 12. The third port 29c is connected to a nitrogen gas supply system 19.

One exhaust system can functions as the exhaust system 17 and the exhaust system 18. The nitrogen gas supply system 19 controls nitrogen supply amounts, based on control signals supplied and received to and from a control unit 24 which control the operation of the cleaning processing apparatus 1. Similarly, the exhaust systems 17, 18 controls exhaust amounts, based on control signals supplied and received to and from the control unit 24.

The first exhaust chamber 21a is in communication with the second exhaust chamber 21b through the gap between the first sealing ring 13 and the spindle 50. The second exhaust chamber 21b is in communication with the gas supply chamber 22 through the gap between the second sealing ring 14 and the spindle 50. In this arrangement, part of nitrogen ($N_2$)gas supplied to the gas supply chamber 22 is discharged from the second exhaust chamber 21b through the second port 29b, and part of the nitrogen ($N_2$)gas led into the second exhaust chamber 21b is further led to the first exhaust chamber 21a through the second exhaust chamber 21b to be discharged through the first port 29a.

The gas supply chamber 22 is in communication with the interior of a chamber 30 through the gap between the third sealing ring 15 and the spindle 50. Here, "the interior of the chamber 30" means the interior of the outer chamber 71a (i.e., the processing chamber 51) in the state that the inner chamber 71b is in the retreated position with the rotor 34 advanced in the outer chamber 71a, and the interior of the inner chamber 71b (i.e., the processing chamber 52) in the state that the inner chamber 71b is in the processing position with the rotor 34 advanced in the outer chamber 71a.

Nitrogen gas is supplied into the gas supply chamber 22 to thereby maintain the gap between the spindle 50 and the outer cylindrical member 32 at a prescribed pressure. In the gas supply chamber 22, a pressure sensor 23a for metering a pressure in the gas supply chamber 22 is provided, and the pressure sensor 23a is connected to the control unit 24 which controls the operation of the cleaning processing apparatus 1. The nitrogen gas supply system 19 controls a nitrogen gas supply amount to the gas supply chamber 22 so that the pressure sensor 23a indicates a constant value, and the exhaust systems 17, 18 controls exhaust amounts of the nitrogen gas from the first exhaust chamber 21a and the second exhaust chamber 21b. The pressure sensor 23a may be provided in the first exhaust chamber 21a or the second exhaust chamber 21b.

A pressure in the gap defined between the spindle 50 and the outer cylindrical member 32 is set to be more positive than a pressure of in the interior of the chamber 30 so that an atmosphere in the chamber 30 does not intrude into the gap defined between the spindle 50 and the outer cylindrical member 32. Specifically, a pressure in the gas supply chamber 22 is kept more positive than that in the chamber 30 to inject nitrogen gas into the chamber 30 through the gap between the third sealing ring 15 and the spindle 50. Accordingly, the chamber pressure sensor 23b is provided in the chamber 30, and the control unit 24 compares metered values given by the pressure sensor 23a and the chamber pressure sensor 23b with each other to control the operation of nitrogen gas supply system 19 and the exhaust systems 17, 18.

It is possible that when a metered value of the pressure sensor 23a is below a set constant value, an alarm is made. It is possible that when a metered vale of the pressure sensor 23a is below a metered value of the chamber pressure sensor 23b over a prescribed period of time, the control unit 24 interrupts the liquid processing in the chamber 30.

Then, the first sealing ring 13, the second sealing ring 14 and the third sealing ring 15 (hereinafter called "the first sealing ring, etc.") will be explained. The first sealing ring 13, etc. are formed of a resinous material. The third sealing ring 15, which is located nearest to an atmosphere in the processing chambers 51, 52 defined in the chamber 30 is formed suitably of PTFE (terafluoroethylene resin) when the chemical resistance to a chemical liquid fed for the processing of the wafers W is most considered, and the third sealing ring 13, etc. are formed of PEEK (polyether etherketone) when thermal resistance is most considered. From the same viewpoint, materials of the first sealing ring 13 and the second sealing ring 14 can be selected.

The clearance between the first sealing ring 13, etc. and the spindle 50 is about 10-50 μm as described above. To realize such narrow clearance, seal ring members whose inner diameter is originally smaller than an outer diameter of the spindle 50 are prepared, and the members are held on the ring member 12. The spindle 50 is press inserted into the bores of the seal ring members and then turned for a prescribed period of time to abrade the seal ring members (hereinafter this machining is called "the aging"). The inner diameters of the sealing ring members are thus enlarged, and the first sealing ring, etc. can be prepared.

At the start of the aging, the seal ring members are in contact with the spindle 50, and when the spindle 50 is turned, frictional heat is generated between the spindle 50 and the seal ring members, and temperatures of the seal ring members rise. A temperature of the outer cylindrical member 32 is also raised by the turn of the spindle 50, and this also raises temperatures of the seal ring members. The aging is performed over a period of time which is longer than the usual operational period of time of the cleaning processing apparatus 1, and the aging is set on until the seal members do not contact the spindle any more. Because a large amount of particles are produced in the aging, wafers W are held in the rotor 34 to be actually cleaning processed after the aging is completed.

Thus in the aging, the temperature of the seal ring members is higher than a temperature of the normal operation of the cleaning processing apparatus 1, which will follow the aging, and a thermal expansion of the seal ring members in the aging is larger than that in the normal operation of the cleaning processing apparatus 1. The sealing members, at this time, having the outer circumferences pressed by the ring member 12, expand not to enlarge the outer diameters but to shorten the inner diameters, whereby the inner surfaces of the bores are abraded. Once the seal ring members, which have come not to contact the spindle anymore in this aging, the first sealing ring 13, etc. will not contact the spindle 50 even when temperatures of the firs seal ring 13, etc. rise in the following cleaning processing.

As apparently shown in FIG. 7, the first sealing ring 13, etc. have smaller inner diameters adjusted by the abrasion on the side of the rotor 34 and has a larger inner diameters on the side of the motor 31 than an outer diameter of the spindle 50. The first sealing ring 13, etc. having such structure can be prepared, e.g., by press inserting the spindle 50 into seal ring members having conical bores which have originally smaller inner diameters on the side of one surfaces than the outer diameter of the spindle 50 and having larger inner diameters on the other surface than the outer diameter of the spindle 50. The seal ring members having the conical bores facilitate the insert of the spindle 50 into the bores, which can reduce the abrasion amounts of the seal ring members.

The third sealing ring 15 is arranged with the longer inner diameter positioned on the side of the motor 31 as shown in FIG. 7, whereby the intrusion of a gas atmosphere from the inside of the chamber 30 into the gap defined between the spindle 50 and the outer cylindrical member 32 can be effectively depressed. On the other hand, the discharge of particles from the gas supply chamber 22 into the chamber 30 is facilitated. The second sealing ring 14 is arranged with the longer diameter positioned on the side of the motor 31 as shown in FIG. 7, even when a gas atmosphere in the chamber 30 intrudes into the gas supply chamber 22, the further intrusion of the gas atmosphere into the second exhaust chamber 21b can be prevented. Oppositely, the second sealing ring 14 is inverted in the X direction, whereby the discharge of particles from the gas supply chamber 22 into the second exhaust chamber 21b is facilitated. The first sealing ring 13 can be arranged for the same effect provided by the second sealing ring 14.

The processing of wafers W by the cleaning processing apparatus 1 having the above-described structure is performed as summarized below. With the rotor 34 positioned outside the outer chamber 71a, wafers W are loaded into the rotor 34. The rotor 34 holding the wafers W is advanced into the outer chamber 71a, and the inner chamber 71b is advanced into the outer chamber 71a to thereby define the processing chamber 52. Then, with the rotor 34 set on rotation, a chemical liquid (e.g., a chemical liquid for removing particles) is injected from the cleaning liquid injection nozzle 55 to the wafers W held in the rotor 34.

At the time of this chemical liquid processing, a pressure in the gas supply chamber 22 is made positive with respect to that in the processing chamber 52, whereby the intrusion of the chemical liquid into the gap defined between the spindle 50 and the outer cylindrical member 32 is prevented. As described above, the clearances between the first, the second and the third seal rings 13, 14, 15, and the spindle 50 is below a half (10-50 μm) of an about 100 μm clearance of, e.g., the conventional metal seal rings. With a smaller nitrogen gas supply amount than in the conventional sealing method, an internal pressure of the gas supply chamber 22 can be kept constant.

The rotor 34 holding wafers W was housed in the inner chamber 71b, an amine-based chemical liquid was supplied at a 15 L/min. flow rate to the wafers W, and the chemical liquid processing was performed for the set periods of time. FIG. 8 is a graph of the water decrease percentages (drying degrees) of water in the chemical liquid. In the Control, the first sealing ring 13, etc. were provided by the conventional metal seal rings, and in the Example, the first sealing ring 13, etc. were provided by resin seal rings.

In the Control, to maintain an internal pressure of the gas supply chamber 22 higher by a preset pressure than an internal pressure of the processing chamber 52 defined by the inner chamber 71b, nitrogen gas had to be supplied to the gas supply chamber 22 at a 70 L/min. flow rate. In contrast to this, in the Example, a nitrogen gas supply amount for keeping the internal pressure of the gas supply chamber 22 at the same pressure as that of the Control was 30 L/min. Based on this, it has been confirmed that the clearances between the first sealing ring 13, etc. and the spindle 50 are made small, whereby the nitrogen gas consumption amount for the cleaning processing can be decreased, and accordingly the running costs of the cleaning processing can be lowered.

As shown in FIG. 8, the chemical liquid was sampled after set periods of time have passed to check water decrease amounts. It has been confirmed that in the Example, the water decrease was depressed to be smaller than that in the Control. It is known that decrease of a water content of a chemical liquid lowers the achievement of the chemical liquid. Thus, FIG. 8 shows that the cleaning processing apparatus 1 according to the present invention is able to depress the deterioration of a chemical liquid. The processing quality can be maintained high.

The nitrogen gas injected from the gas supply chamber 22 to the processing chamber 52 contains particles generated by the rotation of the spindle 50. A smaller nitrogen gas supply amount to the gas supply chamber 22 can result in a smaller nitrogen gas amount to be injected to the processing chamber 52, whereby the contamination of a chemical liquid with the particles can be depressed. The contamination of a chemical liquid with the particles is depressed to resultantly to elongate a lifetime of the chemical liquid. This can also lower running costs of the cleaning processing.

When the chemical liquid processing is completed, the inner chamber 71b is retreated to the retreated position to define the processing chamber 51. With the rotor 34 set on rotation, pure water is injected from the cleaning liquid injection nozzle 53 and the pure water injection nozzles 73a, 73b to rinse away the chemical liquid. When the water cleaning processing is completed, the rotor 34 is rotated to scatter away water drops staying on the wafers W. It is preferable to inject, at this time, nitrogen gas to the wafers W from the cleaning liquid injection nozzle 53. While such processing is being performed in the processing chamber 51, a pressure in the gas supply chamber 22 is retained higher than a pressure in the processing chamber 52, whereby the intrusion of pure water into the gap defined between the spindle 50 and the outer cylindrical member 32 is prevented. The inner chamber 71b is rinsed at the retreated position.

When such cleaning processing is completed, the rotor is retreated out of the outer chamber 71a, and the wafers held in the rotor 34 is unloaded to be carried to an apparatus for the next processing.

Then, a second embodiment of the first sealing ring 13, etc. will be explained. The first sealing ring 13, etc. comprises an O-ring 25a (larger thermal expansion coefficient) and an O-ring 25b (smaller thermal expansion coefficient) of two kinds of resins of different thermal expansion coefficients, which are contacted to each other. The larger and the smaller thermal expansion coefficients here means a relationship of the thermal expansion coefficients which are relative to each other and do not mean their absolute values. A specific combination is that the O-ring 25a is of PTFE (tetrafluoroethylene resin) and the O-ring 25b is of PEEK (polyether ether ketone).

The O-ring 25a has the outer circumference pressed by a ring member 12. The O-ring 25a has a stepped part having a different inner diameter. The O-ring 25b is settled in the stepped part (recess). That is, the O-ring 25b has the outer circumference pressed by the O-ring 25a. A clearance between the inner circumference of the O-ring 25a and the spindle 50 formed by aging is about 10-50 μm. A clearance between the inner circumference of the O-ring 25b and the spindle is about 10-30 μm. The O-ring 25b of a material of a smaller thermal expansion coefficient has small volume changes due to temperature rises during the aging and has a smaller abrasion amount than the O-ring 25a. Thus, a smaller clearance than that of the O-ring 25a can be realized.

A hardness value of the O-ring 25a is preferably smaller than that of the O-ring 25b. This facilitates positioning the o-ring 25a and the O-ring 25b when the outer cylindrical member 32 is disassembled for maintenance or other purposes and reassembling the outer cylindrical member 32.

Embodiments of the present invention have been explained above, but the present invention is not limited to the above-described embodiments. For example, in the above-described embodiments, the rotary shaft sealing mechanisms according to the present invention, i.e., the first sealing ring 13 to the third sealing ring 15 are provided at the three positions. For example, for the purpose of reducing the injection amount of nitrogen gas into the chamber 30, at least the third sealing ring 15 may be provided. For the reduction of the consumption of nitrogen gas, at least the second sealing ring 14 and the third sealing ring 15 may be provided.

FIG. 10 shows a sectional view of a third embodiment of the first sealing ring 13. The first sealing ring 13 may be provided by a lip seal member 27 contacting the spindle 50. Particles generated from the lip seal member 27 due the rotation of the spindle 50 are discharged from the first exhaust chamber 21a together with nitrogen gas flowing from the second exhaust chamber 21b into the first exhaust chamber 21a.

Figure 11:
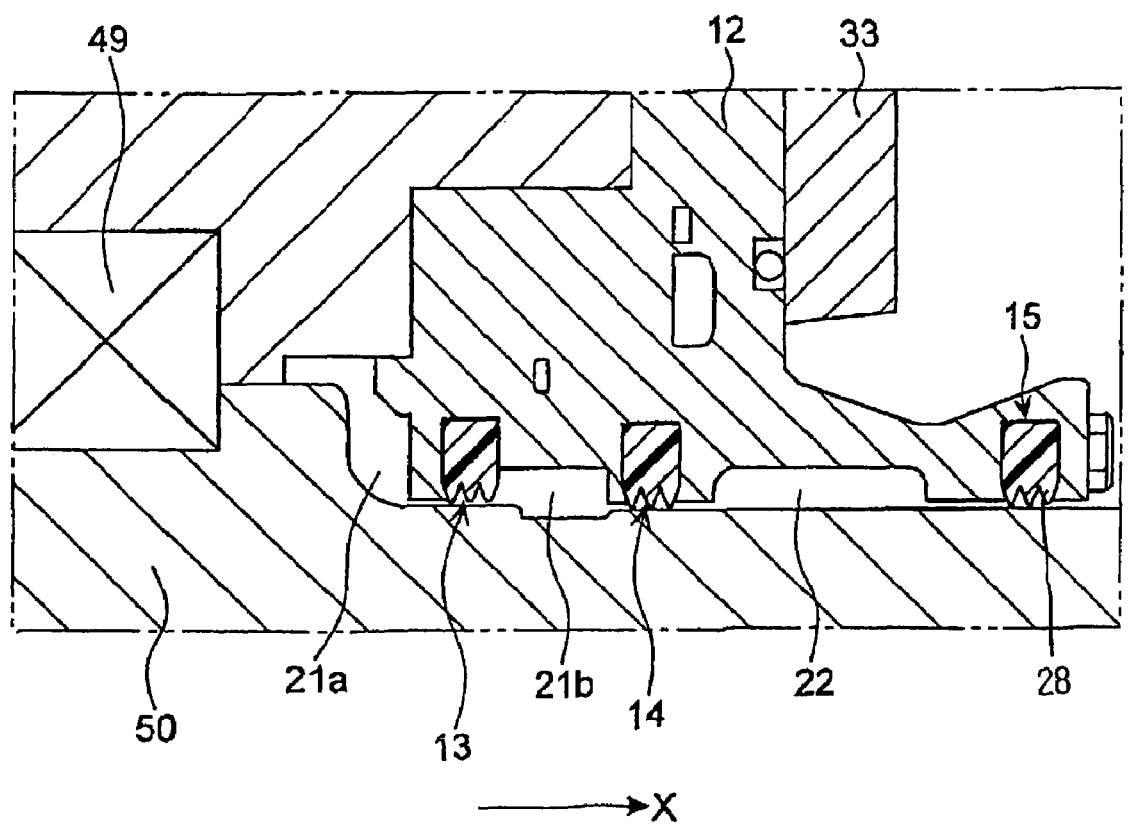
FIG. 11 is a sectional view of the sealing mechanism according to additional other embodiment of the present invention.

The first sealing ring 13, etc. are not limited to the configurations shown in FIG. 7 or 9. FIG. 11 is a sectional view of a fourth embodiment of the first sealing ring 13, etc. As shown in FIG. 11, the first sealing ring 13, etc. may each have a series of substantial V shapes with the convex parts 27 arranged in the longitudinal direction of the spindle 50. The forward ends of the convex portions 27 are abraded in the aging into a flat surfaces which is parallel with the longitudinal direction of the spindle 50.

In constituting the first sealing ring 13, etc. each with a plurality of members, the members are not essentially two O-rings 25a, 25b shown in FIG. 9 and can be, e.g., an O-ring of a smaller thermal expansion sandwiched by O-rings of larger thermal expansion coefficient. In constituting the first sealing ring 13 with the two O-rings 25a, 25b, a combination of the used materials is not essentially PTFE and PEEK. For example, in place of PTFE, PCTFE (polychlrofluoroethylene resin) and PP (polypropylene) or others may be used.

In the above-described description, the cleaning processing apparatus for processing a plurality of wafers W at once has been described above, but the present invention is applicable widely to apparatuses in which objects-to-be-processed, such as substrates, etc., are held and rotated for processing. For example, the present invention is applicable to single-wafer cleaning processing apparatuses or cleaning the surfaces of a single substrate held horizontal, liquid processing apparatuses used in photolithography steps, and resist developers for developing exposed substrates. The substrates are not limited to semiconductor wafers. When objects-to-be-processed are substrates, the substrates can be, in addition to the semiconductor wafers, glass substrates, such as LCD substrates, etc., ceramic substrates and metal substrates.

The processing chamber where objects-to-be-processed are processed are not essentially a tightly closed space nor double-structured. For example, the processing chamber may be a single chamber or a box-shaped vessel having one side surface opened. The processing chamber may be triple structured. The rotary shaft sealing mechanism according to the present invention is not essentially applied to processing apparatuses using liquids but is applicable to processing apparatuses for processing objects-to-be-processed in prescribed gas atmospheres. The objects-to-be-processed are not limited to the substrates.

As described above, according to the present invention, a clearance between the rotary shaft and the sealing rings which are not in contact with each other can be very small, whereby seal between the gap defined between the rotary shaft and the outer cylindrical member, and the processing chamber with a body-to-be-rotated disposed in can be improved. In the liquid processing apparatus having such rotary shaft sealing mechanism, the intrusion of processing liquids and gas atmospheres into the surroundings of the rotary shaft can be suppressed. In a case that a gas is fed into the gap so as to retain a prescribed pressure in the gap between the rotary shaft and the outer cylindrical member, because the clearance between the rotary shaft and the sealing rings are small, a required gas amount can be smaller. Thus, an amount of the gas flowing into the processing chamber for a body-to-be-rotated loaded in can be smaller. The running cost of the liquid processing apparatus can be lower. A smaller amount of gas to be used decreases an amount of particles which will be discharged into the processing chamber, which produces an advantageous effect that a processing liquid to be used in the processing chamber is not easily contaminated and can have a longer lifetime.

What is claimed is:

1. A rotary shaft sealing mechanism comprising:
   a rotary shaft for rotating a body-to-be-rotated;
   an outer cylindrical member disposed around the rotary shaft in an arrangement which does not hinder the rotation of the rotary shaft; and
   a sealing ring of a resin held by the outer cylindrical member in an arrangement which permits the rotary shaft to be passed through the sealing ring,
   wherein a clearance between the rotary shaft and the sealing ring being adjusted by press inserting the rotary shaft into the sealing ring and rotating the rotary shaft to abrade the sealing ring, and
   wherein the sealing ring is constituted with a first O-ring and a second O-ring contacting each other and of different resins which have different thermal expansion coefficients;
   the thermal expansion coefficient of the first O-ring is larger than that of the second O-ring;
   an inner diameter of the second O-ring is smaller than that of the first O-ring; and
   the inner diameter of the second O-ring is adjusted by said abrasion.

2. The rotary shaft sealing mechanism according to claim 1, wherein
   a hardness value of the first O-ring is smaller than that of the second O-ring.

3. The rotary shaft sealing mechanism according to claim 2, wherein
   the first O-ring has a step having a different inner diameter;
   the first O-ring has the outer circumference pressed by the outer cylindrical member; and
   the second O-ring is settled on the step of the first O-ring.

4. The rotary shaft sealing mechanism according to claim 1, wherein
   the first O-ring is formed of PTFE, and the second O-ring is formed of PEEK.

5. A rotary shaft sealing mechanism comprising:
   a rotary shaft for rotating a body-to-be-rotated;
   an outer cylindrical member disposed around the rotary shaft in an arrangement which does not hinder the rotation of the rotary shaft; and
   a sealing ring of a resin held by the outer cylindrical member in an arrangement which permits the rotary shaft to be passed through the sealing ring,
   wherein a clearance between the rotary shaft and the sealing ring being adjusted by press inserting the rotary shaft into the sealing ring and rotating the rotary shaft to abrade the sealing ring, and wherein a gas supply port for supplying a gas to a gap between the outer cylindrical member and the rotary shaft, and an exhaust port for exhausting the gap between the outer cylindrical member and the rotary shaft are formed in the outer cylindrical member in an arrangement which the gas supply port and the exhaust port are formed substantially diametrically through the outer cylindrical member and to be spaced from each other longitudinally of the outer cylindrical member so that the sealing ring are located between the gas supply port and the exhaust port.

6. The rotary shaft sealing mechanism according to claim 5, further comprising:
a pressure sensor for metering a pressure in the gap between the outer cylindrical member and the rotary shaft; and
an alarm for making an alarm when a metered value given by the pressure sensor is below a preset pressure value.

7. A liquid processing apparatus for liquid processing an object-to-be-processed held by a body-to-be-rotated with a processing liquid, comprising:
a chamber for housing the body-to-be-rotated:
at least one processing liquid supply nozzle for supplying the processing liquid to the object-to-be-processed held by the body-to-be-rotated;
a rotary mechanism including a rotary motor, a rotary shaft interconnecting the rotary motor and the body-to-be-rotated, an outer cylinder member disposed around the rotary shaft in an arrangement which does not hinder the rotation of the rotary shaft, and a sealing ring of a resin held by the outer cylindrical member in an arrangement which permits the rotary shaft to be passed through the sealing ring;
a port substantially diametrically formed through the outer cylindrical member on the side nearer to the rotary motor than the sealing ring; and
a gas supply apparatus for supplying a gas to a gap between the outer cylindrical member and the rotary shaft through the port so as to retain a pressure in said gap higher than a pressure in the chamber,
wherein a clearance between the rotary shaft and the sealing ring being adjusted by press inserting the rotary shaft into the sealing ring and rotating the rotary shaft to abrade the sealing ring.

8. A liquid processing apparatus for liquid processing an object-to-be-processed held by a body-to-be-rotated with a processing liquid, comprising:
a chamber for housing the body-to-be-rotated:
at least one processing liquid supply nozzle for supplying the processing liquid to the object-to-be-processed held by the body-to-be-rotated; and
a rotary mechanism including a rotary motor, a rotary shaft interconnecting the rotary motor and the body-to-be-rotated, an outer cylinder member disposed around the rotary shaft in an arrangement which does not hinder the rotation of the rotary shaft, and a sealing ring of a resin held by the outer cylindrical member in an arrangement which permits the rotary shaft to be passed through the sealing ring;
wherein a clearance between the rotary shaft and the sealing ring being adjusted by press inserting the rotary shaft into the sealing ring and rotating the rotary shaft to abrade the sealing ring; and
wherein the sealing ring has an inner diameter on the side of the chamber adjusted by abrasion by the rotary shaft and an inner diameter on the side of the rotary motor formed beforehand to have a diameter larger than the outer diameter of the rotary shaft.

9. A liquid processing apparatus for liquid processing an object-to-be-processed held by a body-to-be-rotated with a processing liquid, comprising:
a chamber for housing the body-to-be-rotated;
at least one processing liquid supply nozzle for supplying the processing liquid to the object-to-be-processed held by the body-to-be-rotated;
a rotary motor;
a rotary shaft interconnecting the rotary motor and the body-to-be-rotated;
an outer cylindrical member disposed around the rotary shaft in an arrangement which does not hinder the rotation of the rotary shaft;
a first sealing ring of a resin held by the outer cylindrical member at a position relatively near to the body-to-be-rotated, and a second sealing ring of a resin held by the outer cylindrical member at a position relatively near to the rotary motor, which are spaced from each other by a distance longitudinally of the outer cylindrical member in an arrangement which permits the rotary shaft to be passed through the first sealing ring and the second sealing ring;
a gas supply port formed in the outer cylindrical member substantially diametrically thereof between the position where the first sealing ring is disposed and the position where the second sealing ring is disposed, for supplying a gas into a gap between the outer cylindrical member and the rotary shaft; and
an exhaust port formed in the outer cylindrical member substantially diametrically thereof at a position nearer to the rotary motor than to the position of the second sealing ring, for exhausting the gap between the outer cylindrical member and the rotary shaft,
respective clearances between the first and the second sealing rings, and the rotary shaft being adjusted by press inserting the rotary shaft into the first and the second sealing rings and rotating the rotary shaft to abrade the first and the second sealing rings.

10. The liquid processing apparatus according to claim 9, further comprising:
a first pressure sensor for metering a pressure in the chamber;
a second pressure sensor for metering a pressure in the gap defined between the outer cylindrical member and the rotary shaft, which is between the first sealing ring and the second sealing ring; and
a gas supply apparatus for comparing a metered value given by the first pressure sensor and a metered value given by the second pressure sensor to supply the gas into the gap through the gas supply port so as to retain a pressure in the gap higher than a pressure in the chamber.

11. The liquid processing apparatus according to claim 10, further comprising
an alarm for making an alarm when a metered value given by the second pressure sensor is below a preset pressure value.

12. The liquid processing apparatus according to claim 9, wherein
the first sealing ring and the second sealing ring are formed of PTFE or PEEK.

13. The liquid processing apparatus according to claim 9, wherein the first sealing ring and the second sealing ring are each constituted with a first O-ring and a second O-ring of different thermal expansion coefficients contact with each other; and the thermal expansion coefficient of the first O-ring is larger than that of the second O-ring.

14. The liquid processing apparatus according to claim 13, wherein a hardness value of the first O-ring is smaller than that of the second O-ring.

15. The liquid processing apparatus according to claim 13, wherein the first O-ring has a step having a different inner diameter;

the first O-ring has the outer circumference pressed by the outer cylindrical member; and the second O-ring is settled on the step of the first O-ring.

16. The liquid processing apparatus according to claim 13, wherein the first O-ring is formed of PTFE, and the second O-ring is formed of PEEK.

17. A rotary shaft sealing mechanism comprising:

a rotary shaft for rotating a body-to-be-rotated;

an outer cylindrical member disposed around the rotary shaft in an arrangement which does not hinder the rotation of the rotary shaft; and a plurality of sealing rings of resin held by the outer cylindrical member in an arrangement which permits the rotary shaft to be passed through the sealing rings, a clearance between the rotary shaft and an internal circumferential surface of each of the sealing rings being adjusted by press inserting the rotary shaft into each of the sealing rings and rotating the rotary shaft to abrade each of the sealing rings, wherein each of the sealing rings is constituted with a first O-ring and a second O-ring which have different thermal expansion coefficients;

the thermal expansion coefficient of the first O-ring is larger than that of the second O-ring;

an inner diameter of the second O-ring is smaller than that of the first O-ring; and the inner diameter of the second O-ring is adjusted by said abrasion.

18. The rotary shaft sealing mechanism according to claim 17 wherein a gas supply port for supplying a gas to a gap between the outer cylindrical member and the rotary shaft, and an exhaust port for exhausting the gap between the outer cylindrical member and the rotary shaft are formed in the outer cylindrical member in an arrangement which the gas supply port and the exhaust port are formed substantially diametrically through the outer cylindrical member and to be spaced from each other longitudinally of the outer cylindrical member so that the sealing rings are located between the gas supply port and the exhaust port.

* * * * *